United States Patent
Endo et al.

(10) Patent No.: US 7,696,286 B2
(45) Date of Patent: Apr. 13, 2010

(54) SEMICONDUCTOR ENCAPSULANT OF EPOXY RESIN, POLYPHENOLIC COMPOUND, FILLER AND ACCELERATOR

(75) Inventors: Masashi Endo, Tokyo (JP); Hirofumi Kuroda, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 482 days.

(21) Appl. No.: 11/729,656

(22) Filed: Mar. 29, 2007

(65) Prior Publication Data

US 2007/0232728 A1 Oct. 4, 2007

(30) Foreign Application Priority Data

Mar. 31, 2006 (JP) .............................. 2006-100287
Jan. 12, 2007 (JP) .............................. 2007-004252

(51) Int. Cl.
C08K 3/04 (2006.01)
C08K 3/36 (2006.01)
C08L 63/04 (2006.01)
H01L 23/29 (2006.01)

(52) U.S. Cl. ................... 525/481; 257/793; 523/466; 523/468; 525/480; 525/485

(58) Field of Classification Search .............. None
See application file for complete search history.

(56) References Cited

U.S. PATENT DOCUMENTS

| 6,486,242 | B1 * | 11/2002 | Tobisawa et al. ............. 524/117 |
| 2004/0217489 | A1 | 11/2004 | Umeno et al. |
| 2006/0094797 | A1 * | 5/2006 | Murotani et al. ............. 523/400 |
| 2007/0043166 | A1 * | 2/2007 | Hoshika ....................... 524/763 |

FOREIGN PATENT DOCUMENTS

| JP | 4-220413 | 8/1992 |
| JP | 2000-026573 | 1/2000 |
| JP | 2003-171529 | 6/2003 |
| JP | 2004-155841 | 6/2004 |
| JP | 2004-203911 | 7/2004 |
| JP | 2005-82722 A * | 3/2005 |
| JP | 2006-274236 | 10/2006 |
| JP | 2006-335797 | 12/2006 |
| JP | 2006-335798 | 12/2006 |
| WO | 2004/081078 | 9/2004 |
| WO | 2006/025429 | 3/2006 |
| WO | 2006/093203 | 9/2006 |

* cited by examiner

*Primary Examiner*—Robert Sellers
(74) *Attorney, Agent, or Firm*—Smith, Gambrell & Russell, LLP

(57) ABSTRACT

A resin composition for semiconductor encapsulation contains an epoxy resin (A); a phenolic compound (B) containing two or more phenolic hydroxyl groups; an inorganic filler (C); and a curing accelerator (D). The epoxy resin (A) contains an epoxy resin (a1) represented by the formula (1) wherein Ar is a $C_6$-$C_{20}$ aryl group, R1 is a $C_1$-$C_6$ hydrocarbon group, R2 is a $C_1$-$C_4$ hydrocarbon group, W1 is oxygen or sulfur, RO is a $C_1$-$C_6$ hydrocarbon group, a=0-10, g=0-3, 0<m<1, 0<n<1, m+n=1 and m:n=1:10 to 1:1, and the resin composition has a moisture absorption rate of 0.22 weight % or less when the composition is humidified at 85° C. and 85% R.H. for 168 hours:

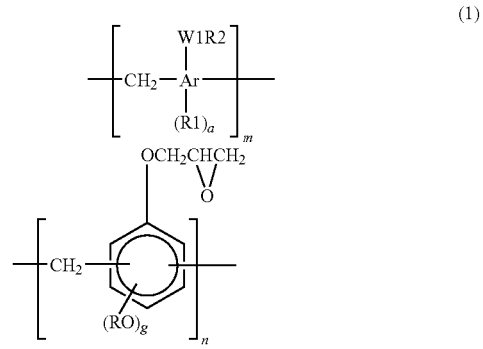

(1)

14 Claims, 1 Drawing Sheet

SEMICONDUCTOR ENCAPSULANT OF EPOXY RESIN, POLYPHENOLIC COMPOUND, FILLER AND ACCELERATOR

This application is based on Japanese patent application Nos. 2006-100287 and 2007-004252, the contents of which are incorporated hereinto by reference.

BACKGROUND

1. Technical Field

The present invention relates to resin compositions for semiconductor encapsulation and semiconductor devices.

2. Related Art

Recent trends towards higher density and higher integration in electronic components and semiconductor devices, such as integrated circuits (ICs), large scale integrated circuits (LSIs), and very-large-scale integrated circuits (VLSIs) stimulate conversion of packaging from insertion mounting to surface mounting. Such trends require lead frames with an increased number of pins and leads with narrower intervals. Surface mount quad flat packages (QFPs), which are compact and lightweight, are used for a variety of semiconductor devices. These semiconductor devices are generally encapsulated with epoxy resin compositions, which have high compatibility among high productivity rates, low material costs, and high reliability.

Since these epoxy resin compositions for semiconductor encapsulation must be nonflammable, brominated epoxy resins, such as tetrabromobisphenol A epoxy resins and brominated phenol novolak epoxy resins, and antimony oxide, as flame retardants, are compounded to main components.

In recent years, however, use of halogenated compounds, which involve the risk of generation of dioxin analogs, and highly toxic antimony compounds has been regulated for the purpose of environmental protection. In resin compositions for semiconductor encapsulation, technology on fire retardancy that does not use halogenated compounds, such as brominated epoxy resins, and antimony oxide has been studied. When semiconductor devices are preserved at high temperatures of 150 to 200° C. for long hours, bromine atoms and antimony compounds in the flame retardants cause an increase in resistance of the semiconductor devices and disconnection of gold wires. From this viewpoint, epoxy resin compositions for semiconductor encapsulation not containing bromine flame retardants or antimony compounds are required. Metal oxide flame retardants, such as aluminum hydroxide and magnesium hydroxide, have been used instead of bromine flame retardants or antimony compounds. Unfortunately, these metal oxide flame retardants lead to an increase in viscosity of melt resins and a decrease in soldering resistance of the composition.

Japanese Unexamined Patent Application Publication Nos. 2004-203911 and 2004-155841 disclose epoxy resin compositions for semiconductor encapsulation containing epoxy resins having biphenyl aralkyl skeletons. Although these epoxy resin compositions do not contain flame retardants, they exhibit high flame retardancy. Furthermore, these epoxy resin compositions have advantages of low moisture absorption, low modulus when being heated, high adhesiveness, resulting in production of highly reliable semiconductor devices. A disadvantage of these resins, however, is high production costs.

An object of the present invention is to provide an epoxy resin composition for semiconductor encapsulation which does not contain a brominated flame retardant or an antimony compound, exhibit high flame resistance, and high soldering resistance after humidified, and has an advantage of low material and production costs.

Another object of the present invention is to provide a semiconductor device encapsulated by the cured resin composition.

SUMMARY OF THE INVENTION

That is, the present invention is specified by the matters described in the following (1) to (14).

(1) A resin composition for semiconductor encapsulation, comprising:

(A) an epoxy resin;

(B) a phenolic compound containing two or more phenolic hydroxyl groups;

(C) an inorganic filler; and (D) a curing accelerator;

wherein the epoxy resin (A) comprises an epoxy resin (a1) represented by the formula (1), and the resin composition has a moisture absorption rate of 0.22 weight % or less when the composition is humidified at 85° C. and 85% R.H. for 168 hours:

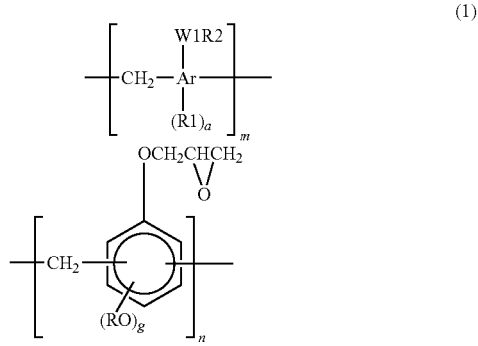

wherein Ar represents an aryl group having 6 to 20 carbon atoms; R1's each represent a hydrocarbon group having 1 to 6 carbon atoms and may be the same or different; R2 represents a hydrocarbon group having 1 to 4 carbon atoms; W1 represents an oxygen or sulfur atom; R0's each represent a hydrocarbon group having 1 to 6 carbon atoms and may be the same or different; a is an integer of 0 to 10; g is an integer of 0 to 3; and m and n represent molar ratios and satisfy $0<m<1$, $0<n<1$, $m+n=1$, and the ratio $m/n=1/10$ to $1/1$.

(2) The resin as described in (1), wherein the epoxy resin (a1) is a glycidyl-etherification product of a phenol resin with epichlorohydrin, the phenol resin being a co-condensation product of a phenol, an aldehyde, and a compound (G) represented by the formula (2):

wherein Ar represents an aryl group having 6 to 20 carbon atoms; R1's each represent a hydrocarbon group having 1 to 6 carbon atoms and may be the same or different; R2 represents a hydrocarbon group having 1 to 4 carbon atoms; W1 represents an oxygen or sulfur atom; and a is an integer of 0 to 10.

(3) The resin as described in (1), wherein the epoxy resin (a1) is represented by the formula (3):

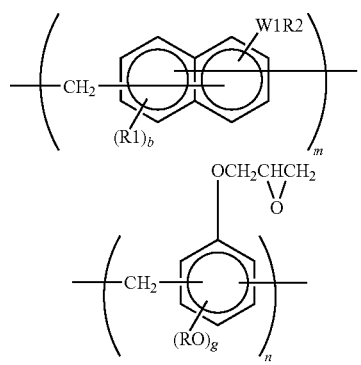

(3)

wherein R1's each represent a hydrocarbon group having 1 to 6 carbon atoms and may be the same or different; R2 represents a hydrocarbon group having 1 to 4 carbon atoms; W1 represents an oxygen or sulfur atom; R0's each represent a hydrocarbon group having 1 to 6 carbon atoms and may be the same or different; b is an integer of 0 to 5; g is an integer of 0 to 3; and m and n represent molar ratios and satisfy 0<m<1, 0<n<1, m+n=1, and the ratio m/n=1/10 to 1/1.

(4) The resin as described in (3), wherein the epoxy resin is represented by the formula (4):

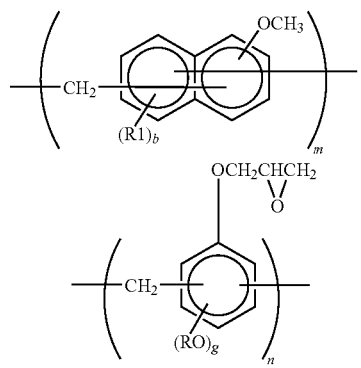

(4)

wherein R1's each represent a hydrocarbon group having 1 to 6 carbon atoms and may be the same or different; R0's each represent a hydrocarbon group having 1 to 6 carbon atoms and may be the same or different; b is an integer of 0 to 5; g is an integer of 0 to 3; and m and n represent molar ratios and satisfy 0<m<1, 0<n<1, m+n=1, and the ratio m/n=1/10 to 1/1.

(5) The resin as described in (1), wherein the phenolic compound (B) is represented by the formula (5):

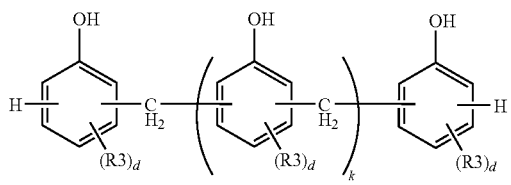

(5)

wherein R3's each represent a hydrocarbon group having 1 to 4 carbon atoms and may be the same or different; d is an integer of 0 to 2; and the average of k is in the range of 0 to 8.

(6) The resin as described in (1), wherein the curing accelerator (D) is at least one compound selected from the group consisting of a compound represented by the formula (6), a compound represented by the formula (7), a compound represented by the formula (8), and a compound represented by the formula (9):

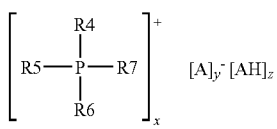

(6)

wherein P represents a phosphorus atom; R4, R5, R6, and R7 each represent an aryl or alkyl group; A represents an anion of an aromatic organic acid having at least one functional group selected from the group consisting of a hydroxyl group, a carboxyl group, and a thiol group in the aromatic ring; AH represents an aromatic organic acid having at least one functional group selected from the group consisting of a hydroxyl group, a carboxyl group, and a thiol group in the aromatic ring; x and y each represent an integer of 1 to 3; z represents an integer of 0 to 3; and x=y;

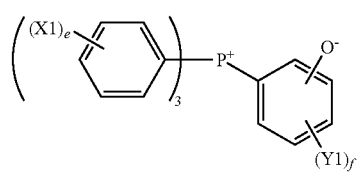

(7)

wherein X1 represents an alkyl group having 1 to 3 carbon atoms; Y1 represents a hydroxyl group; and e and f represents an integer of 0 to 3;

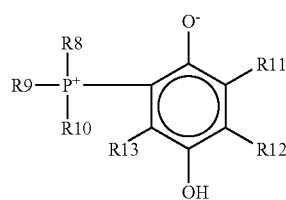

(8)

wherein P represents a phosphorus atom; R8, R9, and R10 represent alkyl groups each having 1 to 12 carbon atoms or aryl groups each having 6 to 12 carbon atoms and may be the same or different; R11, R12, and R13 represent hydrogen atoms or hydrocarbon groups each having 1 to 12 carbon atoms and may be the same or different where R11 and R12 may be mutually linked to form a cyclic structure; and

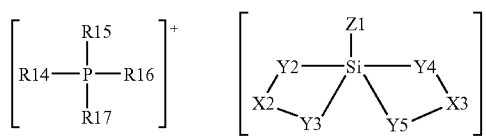

(9)

wherein P represents a phosphorus atom; Si represents a silicon atom; R14, R15, R16, and R17 represent organic groups each having an aromatic or heterocyclic ring or aliphatic groups and may be the same or different; X2 represents an organic group linked with both groups Y2 and Y3; X3 represents an organic group linked with both groups Y4 and Y5; Y2 and Y3 each represent a proton donor moiety from which two protons are lost, and are linked with the silicon atom to form a chelate structure; Y4 and Y5 each represent a proton donor moiety from which two protons are lost, and are linked with the silicon atom to form a chelate structure; X2 and X3 may be the same or different; Y2, Y3, Y4, and Y5 are the same or different; and Z1 represents an organic group having an aromatic ring or heterocyclic ring or an aliphatic group.

(7) The resin as described in (1), wherein the resin composition further comprises:

(E) a silane coupling agent; and (F) an aromatic compound having at least two hydroxyl groups combined with each of adjacent carbon atoms comprising the aromatic ring.

(8) The resin as described in (7), wherein the aromatic compound (F) has two hydroxyl groups combined with each of adjacent carbon atoms comprising the aromatic ring.

(9) The resin as described in (7), wherein the aromatic compound (F) has a naphthalene ring and at least two hydroxyl groups combined with each of adjacent carbon atoms comprising the naphthalene ring.

(10) The resin as described in (7), wherein the aromatic compound (F) has a naphthalene ring and two hydroxyl groups combined with each of adjacent carbon atoms comprising the naphthalene ring.

(11) The resin as described in (7), wherein the resin composition contains the aromatic compound (F) in an amount of 0.01 weight % or more to 1 weight % or less to the total weight of the resin composition.

(12) The resin as described in (7), wherein the resin composition contains the silane coupling agent (E) in an amount of 0.01 weight % or more to 1 weight % or less to the total weight of the resin composition.

(13) The resin as described in (7), wherein the resin composition contains the inorganic filler (C) in an amount of 80 weight % or more to 92 weight % or less to the total weight of the resin composition.

(14) According to the present invention, there is provided a semiconductor device comprising:

a semiconductor element encapsulated by the cured resin of the resin composition described (1).

According to the present invention, there is provided an epoxy resin composition for semiconductor encapsulation which does not contain a brominated flame retardant or an antimony compound, exhibit high flame resistance, and high soldering resistance after humidified, and has an advantage of low material and production costs, and a semiconductor device encapsulated by the cured resin composition.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
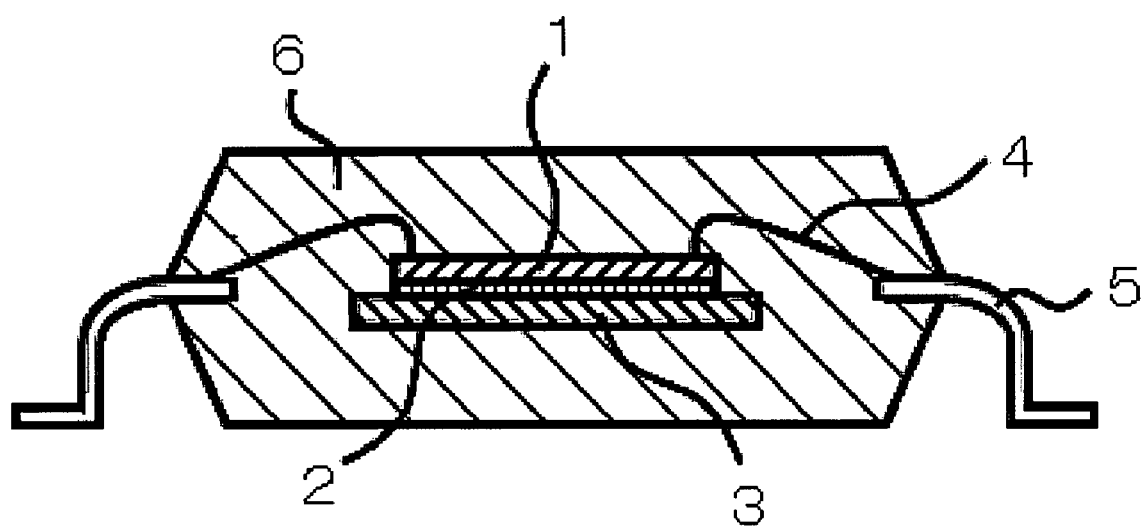
FIG. 1 is a cross-sectional view of a semiconductor device using an epoxy resin composition according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The present invention provides a resin composition for semiconductor encapsulation comprising an epoxy resin, a phenolic compound (B) containing two or more phenolic hydroxyl groups, an inorganic filler (C), and a curing accelerator (D). The epoxy resin (A) comprises an epoxy resin (a1) represented by the formula (1). The resin composition has a moisture absorption rate of 0.22 weight % or less when the composition is humidified at 85° C. and 85% relative humidity (R.H.) for 168 hours. This epoxy resin composition exhibits high flame resistance and high soldering resistance after humidification regardless of low material cost.

Hereinafter, each component will be described in detail.

The epoxy resin (a1) according to the present invention is represented by the formula (1):

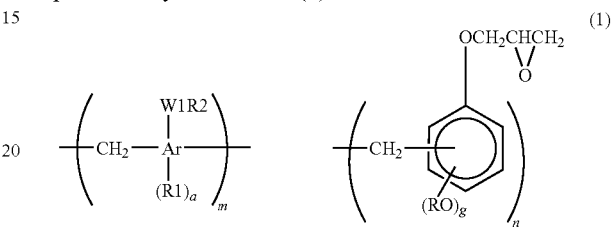

wherein Ar represents an aryl group having 6 to 20 carbon atoms; R1's each represent a hydrocarbon group having 1 to 6 carbon atoms and may be the same or different; R2 represents a hydrocarbon group having 1 to 4 carbon atoms; W1 represents an oxygen or sulfur atom; R0's each represent a hydrocarbon group having 1 to 6 carbon atoms and may be the same or different; a is an integer of 0 to 10; g is an integer of 0 to 3; and m and n represent molar ratios and satisfy $0<m<1$, $0<n<1$, $m+n=1$, and the ratio $m/n=1/10$ to $1/1$.

This epoxy resin (a1) contains many intramolecular aromatic carbon atoms, and cured epoxy resin compositions containing this epoxy resin exhibit high flame resistance and low moisture absorption. The ratio m/n of the structural units m and n in the formula (1) is in the range of preferably 1/10 to 1/1 and more preferably 1/9 to 1/2. A ratio m/n within this range leads to high flame resistance, low viscosity, and thus high flowability of the resin composition.

Examples of the epoxy resin (a1) include, but not limited to, epoxy resins represented by the formula (4), the formula (10), the formula (11), and the formula (12):

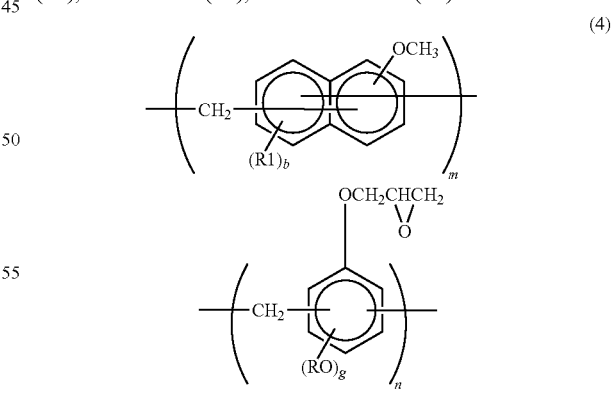

wherein R1's each represent a hydrocarbon group having 1 to 6 carbon atoms and may be the same or different; R0's each represent a hydrocarbon group having 1 to 6 carbon atoms and may be the same or different; b is an integer of 0 to 5; g is an integer of 0 to 3; and m and n represent molar ratios and satisfy $0<m<1$, $0<n<1$, $m+n=1$, and the ratio $m/n=1/10$ to $1/1$;

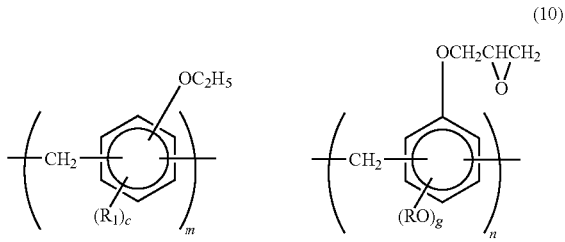

(10)

wherein R1's each represent a hydrocarbon group having 1 to 6 carbon atoms and may be the same or different; R0's each represent a hydrocarbon group having 1 to 6 carbon atoms and may be the same or different; c is an integer of 0 to 3; g is an integer of 0 to 3; and m and n represent molar ratios and satisfy $0<m<1$, $0<n<1$, $m+n=1$, and the ratio m/n=1/10 to 1/1;

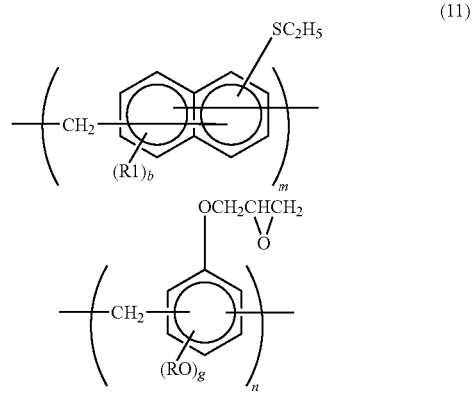

(11)

wherein R1's each represent a hydrocarbon group having 1 to 6 carbon atoms and may be the same or different; R0's each represent a hydrocarbon group having 1 to 6 carbon atoms and may be the same or different; b is an integer of 0 to 5; g is an integer of 0 to 3; and m and n represent molar ratios and satisfy $0<m<1$, $0<n<1$, $m+n=1$, and the ratio m/n=1/10 to 1/1; and

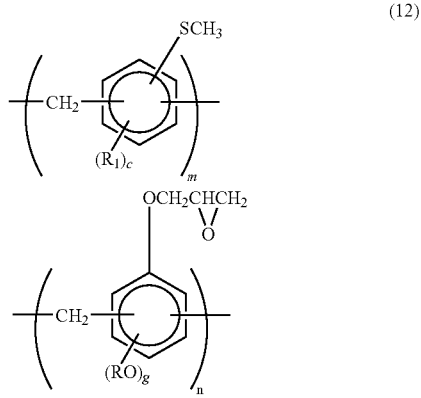

(12)

wherein R1's each represent a hydrocarbon group having 1 to 6 carbon atoms and may be the same or different; R0's each represent a hydrocarbon group having 1 to 6 carbon atoms and may be the same or different; c is an integer of 0 to 3; g is an integer of 0 to 3; and m and n represent molar ratios and satisfy $0<m<1$, $0<n<1$, $m+n=1$, and the ratio m/n=1/10 to 1/1.

In view of flame resistance, epoxy resins represented by the formula (4) (Ar in the formula (1) corresponds to the naphthalene ring in formula (4)) and epoxy resins represented by the formula (11) are more preferred.

The epoxy resin (a1) represented by the formula (1), used in the present invention, can be prepared by glycidyl-etherification of a co-condensation product of a phenol, an aldehyde, and a compound (G) represented by the formula (2), using epichlorohydrin:

$$(R1)_a\text{---}Ar\text{---}W1R2 \quad (2)$$

wherein Ar represents an aryl group having 6 to 20 carbon atoms; R1's each represent a hydrocarbon group having 1 to 6 carbon atoms and may be the same or different; R2 represents a hydrocarbon group having 1 to 4 carbon atoms; W1 represents an oxygen or sulfur atom; and a is an integer of 0 to 10.

The compound (G) is characterized in that an aromatic ring not bonded to a glycidyl ether group is linked with W1R2 where W1 represents an oxygen or sulfur atom and R2 represents a hydrocarbon group having 1 to 4 carbon atoms. Bonding of W1R2 imparts polarity to the compound (G) represented by the formula (2). This molecular polarity improves the reactivity and facilitates introduction of the structure of the compound (G) into the novolak resin composed of the phenol and aldehyde. Furthermore, this epoxy resin (a1) can be readily produced or available at lower material costs compared with phenol aralkyl epoxy resins having biphenylene skeletons, which also exhibit high flame resistance and low moisture absorption.

Examples of phenols used in production of the epoxy resin (a1) include, but not limited to, phenolic compounds used in synthesis of general phenol resins, e.g. phenol, o-cresol, p-cresol, m-cresol, butylphenol, xylenol, nonylphenol, 1-naphthol, and 2-naphthol. These phenols may be used alone or in combination.

Examples of aldehydes used in production of the epoxy resin (a1) include, but not limited to, aldehyde compounds used in synthesis of general phenol resins, e.g. formaldehyde, acetaldehyde, benzaldehyde, and salicylaldehyde. These aldehydes may be used alone or in combination.

Examples of the compound (G) represented by the formula (2) include methoxybenzene, ethoxybenzene, methyl phenyl sulfide, ethyl phenyl sulfide, methoxynaphthalene, ethoxynaphthalene, methyl naphthyl sulfide, and ethyl naphthyl sulfide. Among these compounds, compounds represented by the formula (13) are preferred and methoxynaphthalene compounds represented by the formula (14) are particularly preferred, considering high flame resistance and low moisture absorption:

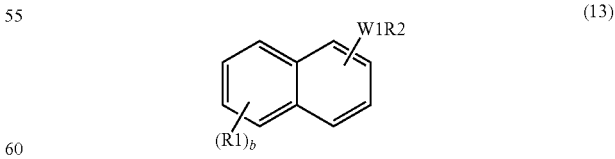

(13)

wherein R1's each represent a hydrocarbon group having 1 to 6 carbon atoms and may be the same or different; R2 represents a hydrocarbon group having 1 to 4 carbon atoms; W1 represents an oxygen or sulfur atom; and b is an integer of 0 to 5; and

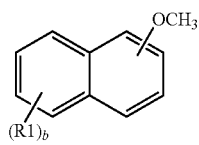

(14)

wherein R1's each represent a hydrocarbon group having 1 to 6 carbon atoms and may be the same or different; and b is an integer of 0 to 5.

Synthetic methods of phenol resins, which are precursors of the epoxy resin (a1) used in the present invention, are not limited. For example, the phenol resins can be prepared by co-condensation of phenols, aldehydes, and the compound (G) represented by the formula (2) in the presence of acid catalysts.

The epoxy resin (a1) used in the present invention may be synthesized by any process. For example, a phenol resin, which is the precursor of the epoxy resin (a1), is dissolved in an excess amount of epichlorohydrin, and the mixture is allowed to react in the presence of an alkali metal hydroxide, e.g. sodium hydroxide or potassium hydroxide at 50 to 150° C. and preferably 60 to 120° C. for 1 to 10 hours. After the reaction, the excess epichlorohydrin is removed by distillation. The residue is dissolved in a solvent such as toluene or methyl isobutyl ketone. The solution is filtered and is washed with water to remove the inorganic salt. The solvent is removed by distillation to yield an intended epoxy resin (a1).

In the present invention, any other epoxy resin may be used in combination with the epoxy resin (a1) represented by the formula (1). Examples of such epoxy resins include biphenyl epoxy resins, bisphenol epoxy resins, stilbene epoxy resins, phenol novolak epoxy resins, cresol novolak epoxy resins, triphenolmethane-type epoxy resins, phenol aralkyl epoxy resins having phenylene skeletons, phenol aralkyl epoxy resins having biphenylene skeletons, naphthol-type epoxy resins, alkyl-modified triphenolmethane-type epoxy resins, triazine-ring-containing epoxy resins, and dicyclopentadiene-modified phenol epoxy resins. In consideration of moisture resistance of epoxy resin compositions for semiconductor encapsulation, it is preferred that the contents of ionic impurities such as sodium cations and chlorine anions be as low as possible. In view of curability, the epoxy equivalent is preferably in the range of 100 g/eq to 500 g/eq.

If any other epoxy resin is used in combination, the proportion of the epoxy resin (a1) to the overall epoxy resin is preferably 10 weight % or more, more preferably 30 weight % or more, and most preferably 50 weight % or more, in order to achieve high flame resistance.

The resin composition according to the present invention contains a phenolic compound (B) containing two or more phenolic hydroxyl groups, as a curing agent. This phenolic compound (B) ensures high flame resistance and moisture resistance, excellent electrical characteristics, curability, and preservation stability. The phenolic compound (B) may be a monomer, oligomer, or polymer having two or more phenolic hydroxyl groups in the molecule. The molecular weight and structure of the phenolic compound (B) are not limited. Examples of the phenolic compound (B) include phenol novolak resins, cresol novolak resins, triphenolmethane-type phenol resins, terpene-modified phenol resins, dicyclopentadiene-modified phenol resins, phenol aralkyl resins having phenylene and/or biphenylene skeletons, naphthol aralkyl resins having phenylene and/or biphenylene skeletons, and bisphenol compounds. These compounds may be used alone or in combination. In view of curability, the hydroxyl equivalent of the compound is preferably in the range of 90 g/eq and 250 g/eq.

Preferably, the phenolic compounds (B) should be represented by the formula (5):

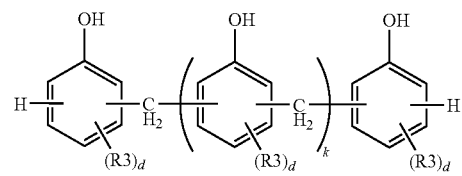

(5)

wherein R3's each represent a hydrocarbon group having 1 to 4 carbon atoms and may be the same or different; d is an integer of 0 to 2; and the average of k is in the range of 0 to 8.

This phenolic compound represented by the formula (5) has many phenolic hydroxyl groups. An epoxy resin composition containing this phenolic compound exhibits high reactivity, moldability, and productivity, resulting in low material and production costs. A cured product thereof exhibits high crosslink density and glass transition temperature (Tg). Non-limiting examples of the phenolic resin represented by the formula (5) include phenol novolak resins and cresol novolak resins.

The proportion of the phenolic compound represented by the formula (5) is not limited and preferably 10 weight % or more, more preferably 30 weight % or more, and most preferably 50 weight % or more to the total amount of the phenolic compounds (B) in order to ensure satisfactory reactivity and productivity.

The inorganic filler (C) used in the present invention may be any common inorganic filler used for resin compositions for semiconductor encapsulation. Examples of the inorganic filler (C) include fused silica, spherical silica, crystalline silica, alumina, silicon nitride, and aluminum nitride. In view of moldability, the particle size of the inorganic filler (C) is preferably in the range of 0.01 µm to 150 µm. The content of the inorganic filler (C) to the overall epoxy resin composition ranges from preferably 80 weight % to 92 weight %, more preferably 82 weight % to 91 weight %, and most preferably 84 weight % to 90 weight %. An inorganic filler content within this range can prevent moisture absorption of the epoxy resin composition, and can ensure high mechanical strength and thus high soldering crack resistance. Within such a range of the inorganic filler content, the epoxy resin composition has satisfactory flowability and thus satisfactory moldability.

The curing accelerator (D) in the present invention is used to facilitate the reaction of the epoxy groups in the epoxy resin with phenolic hydroxyl groups of the phenolic compound. Any curing accelerator used in common epoxy resin compositions for semiconductor encapsulation may be used. Examples of such curing accelerators include phosphorus-containing compounds, such as organic phosphines, tetra-substituted phosphonium compounds, phosphobetaines, adducts of phosphines and quinones, and adducts of phosphonium compounds and silane compounds; and nitrogen-containing compounds such as 1,8-diazabicyclo(5,4,0)undecene-7, benzyldimethylamine, and 2-methylimidazole. Among these, phosphorus-containing compounds are preferred. Tetra-substituted phosphonium compounds are more preferred in view of flowability of the resin composition. In view of low modulus when the cured epoxy resin composition is heated, phosphobetaine compounds and adducts of phosphine compounds and quinone compounds are preferred. In view of latent curability, adducts of phosphonium compounds and silane compounds are preferred.

Examples of organic phosphines usable in the present invention include primary phosphines, such as ethylphosphine and phenylphosphine; secondary phosphines, such as dimethylphosphine and diphenylphosphine; and tertiary phosphines, such as trimethylphosphine, triethylphosphine, tributylphosphine, and triphenylphosphine.

The tetra-substituted phosphonium compounds usable in the present invention are represented by the formula (6):

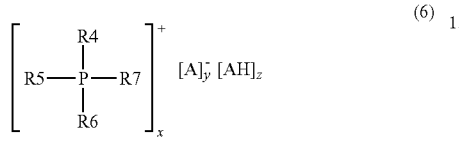

(6)

wherein P represents a phosphorus atom; R4, R5, R6, and R7 each represent an aryl or alkyl group; A represents an anion of an aromatic organic acid having at least one functional group selected from the group consisting of a hydroxyl group, a carboxyl group, and a thiol group in the aromatic ring; AH represents an aromatic organic acid having at least one functional group selected from the group consisting of a hydroxyl group, a carboxyl group, and a thiol group in the aromatic ring; x and y each represent an integer of 1 to 3; z represents an integer of 0 to 3; and x=y;

The tetra-substituted phosphonium compound represented by the formula (6) can be prepared, for example, as follows: A tetra-substituted phosphonium halide, an aromatic organic acid, and a base are dissolved in an organic solvent to generate anions of the aromatic organic acid in the solution. Water is added to the solution to precipitate a compound represented by the formula (6). Preferably, R4, R5, R6, and R7 linked to the phosphorus atom is phenyl groups, AH is a compound having a hydroxyl group in the aromatic ring, i.e. a phenol compound, and A is an anion of the phenol compound, in the compound represented by the formula (6).

The phosphobetaine compounds usable in the present invention are represented by the formula (7):

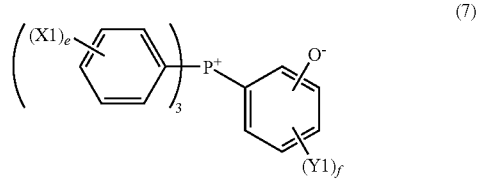

(7)

wherein X1 represents an alkyl group having 1 to 3 carbon atoms; Y1 represents a hydroxyl group; and e and f represents an integer of 0 to 3;

The phosphobetaine compound represented by the formula (7) can be prepared by, for example, to contact between a triarylphosphine (tertiary phosphine) and a diazonium, and to exchange the diazonium group of the diazonium salt for the tertiary phosphine. Any other process may also be available.

Adducts of a phosphine compound and a quinone compound usable in the present invention are represented by the formula (8):

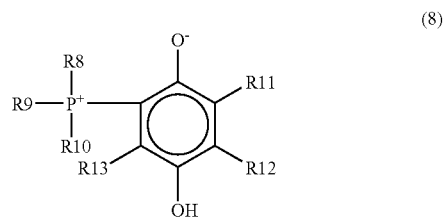

(8)

wherein P represents a phosphorus atom; R8, R9, and R10 represent alkyl groups each having 1 to 12 carbon atoms or aryl groups each having 6 to 12 carbon atoms and may be the same or different; R11, R12, and R13 represent hydrogen atoms or hydrocarbon groups each having 1 to 12 carbon atoms and may be the same or different wherein R11 and R12 may be mutually linked to form a cyclic structure.

Examples of the preferred phosphine compounds used for preparation of the adducts include triphenylphosphine, tris (alkylphenyl)phosphine, tris(alkoxyphenyl)phosphine, trinaphthylphosphine, and tris(benzyl)phosphine. These phosphine compounds may have any substituent such as alkyl and alkoxy groups. The alkyl and alkoxy groups preferably have 1 to 6 carbon atoms. Triphenylphosphine is preferred because it is readily available.

Examples of quinone compounds used for preparation of the adducts include o-benzoquinone, p-benzoquinone, and anthraquinones. Among these, p-benzoquinone, exhibiting high preservation stability, is preferred.

The adduct of the phosphine compound and the quinone compound can be prepared by mixing an organic tertiary phosphine and a benzoquinone in a good solvent. Solvents exhibiting low dissolving power for the adduct are preferred. Examples of such solvents include ketones, i.e., acetone and methyl ethyl ketone. Any other solvent may also be used.

Adduct of 1,4-benzoquinone and triphenylphosphine is preferred because this adduct decreases the modulus when the cured epoxy resin composition is heated. In this adduct, R8, R9, and R10 are phenyl groups, and R11, R12, and R13 are hydrogen atoms in the formula (8).

The adduct of the phosphonium compound and a silane compound usable in the present invention is represented by the formula (9):

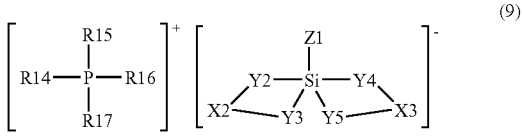

(9)

wherein P represents a phosphorus atom; Si represents a silicon atom; R14, R15, R16, and R17 represent organic groups each having an aromatic or heterocyclic ring or aliphatic groups and may be the same or different; X2 represents an organic group linked with both groups Y2 and Y3; X3 represents an organic group linked with both groups Y4 and Y5; Y2 and Y3 each represent a proton donor moiety from which two protons are lost, and are linked with the silicon atom to form a chelate structure; Y4 and Y5 each represent a proton donor moiety from which two protons are lost, and are linked with the silicon atom to form a chelate structure; X2 and X3 may be the same or different; Y2, Y3, Y4, and Y5 are the same or different; and Z1 represents an organic group having an aromatic ring or heterocyclic ring or an aliphatic group.

Examples of R14, R15, R16, and R17 in the formula (9) include unsubstituted or substituted aromatic groups, such as a phenyl group, methylphenyl group, methoxyphenyl group, hydroxyphenyl group, naphthyl group, hydroxynaphthyl group, benzyl group, methyl group, ethyl group, n-butyl group, n-octyl group, and cyclohexyl group. Among these, a phenyl group, methylphenyl group, methoxyphenyl group, hydroxyphenyl group, and hydroxynaphthyl group are preferred.

In the formula (9), X2 represents an organic group linked with both Y2 and Y3, and X3 represents an organic group linked with both Y4 and Y5. Y2 and Y3 each represent a proton donor moiety from which two protons are lost, and are linked with the silicon atom to form a chelate structure. Similarly, Y4 and Y5 each represent a proton donor moiety from which two protons are lost, and are linked with the silicon atom to form a chelate structure. X2 and X3 may be the same or different, and Y2, Y3, Y4, and Y5 may be the same or different. These —Y2-X2-Y3- and —Y4-X3-Y5-groups include divalent or multivalent proton donor moieties from which two protons had been released. Examples of divalent or multivalent proton donors include catechol, pyrogallol, 1,2-dihydroxynaphthalene, 2,3-dihydroxynaphthalene, 2,2'-diphenol, 1,1'-bi-2-naphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol, and glycerol. Among these, catechol, 1,2-dihydroxynaphthalene, and 2,3-dihydroxynaphthalene are preferred.

Z1 in the formula (9) represents an organic group having an aromatic ring or heterocyclic ring or an aliphatic group. Examples of such a group include aliphatic hydrocarbon groups, such as a methyl group, ethyl group, propyl group, butyl group, hexyl group, and octyl group; aromatic hydrocarbon groups, such as a phenyl group, benzyl group, naphthyl group, and biphenyl group; and reactive substituents, such as a glycidyloxypropyl group, mercaptopropyl group, aminopropyl group, and vinyl group. Among these, a methyl group, ethyl group, phenyl group, naphthyl group, and biphenyl group are preferred in view of thermal stability.

The adduct of the phosphonium compound and the silane compound is prepared as follows: Into a flask containing methanol, a silane compound such as phenyltrimethoxysilane, a divalent or multivalent proton donor such as 2,3-dihydroxynaphthalene are dissolved. With stirring the solution at room temperature, a sodium methoxide in methanol solution is added dropwise. A methanol solution of a tetrasubstituted phosphonium halide, for example, tetraphenylphosphonium bromide is added dropwise to precipitate crystals. The crystalline precipitate is separated by filtration, is washed with water, and is dried under vacuum to yield an adduct of the phosphonium compound and a silane compound. Any other process may also be employed in the present invention.

The amount of the curing accelerator (D) used in the present invention preferably ranges from 0.1 weight % to 1 weight % in the overall epoxy resin composition. A curing accelerator (D) content within this range ensures satisfactory curabirity and high flowability.

The silane coupling agent (E) used in the present invention reacts with both the epoxy resin and the inorganic filler and enhances the interfacial strength therebetween. Nonlimiting examples of such silane coupling agents include epoxysilane, aminosilane, ureidosilane, and mercaptosilane. An aromatic compound (F) having at least two hydroxyl groups combined with each of adjacent carbon atoms comprising the aromatic ring, which will be described below, reduces the viscosity and improves flowability of the epoxy resin composition by the synergy effect with the silane coupling agent (E). In other words, the silane coupling agent (E) enhances the function of the aromatic compound (F).

Examples of the epoxysilane include γ-glycidoxypropyltriethoxysilane, γ-glycidoxypropyltrimethoxysilane, γ-glycidoxypropylmethyldimethoxysilane, and β-(3,4-epoxycyclohexyl)ethyltrimethoxysilane. Examples of the aminosilane include γ-aminopropyltriethoxysilane, γ-aminopropyltrimethoxysilane, N-β-(aminoethyl)-γ-aminopropyltrimethoxysilane, N-β-(aminoethyl)-γ-aminopropylmethyldimethoxysilane, N-phenyl-γ-aminopropyltriethoxysilane, N-phenyl-γ-aminopropyltrimethoxysilane, N-β-(aminoethyl)-γ-aminopropyltriethoxysilane, N-6-(aminohexyl)-3-aminopropyltrimethoxysilane, and N-(3-(trimethoxysilylpropyl)-1,3-benzenedimethanane.

Examples of the ureidosilane include γ-ureidopropyltriethoxysilane and hexamethyldisilazane. Examples of the mercaptosilane include γ-mercaptopropyltrimethoxysilane. These silane coupling agents (E) may be used alone or in combination.

The content of the silane coupling agent (E) used in the present invention is in the ranges of preferably 0.01 weight % to 1 weight %, more preferably 0.05 weight % to 0.8 weight %, and most preferably 0.1 weight % to 0.6 weight % in the overall epoxy resin composition. A silane coupling agent (E) content within this range ensures sufficiently low viscosity and high flowability of the epoxy resin composition by the synergy effect with the aromatic compound (F), and leads to high soldering crack resistance of semiconductor devices due to high interfacial strength between the epoxy resin and the inorganic filler and due to low moisture absorption of the cured epoxy resin composition.

The aromatic compound (F) having at least two hydroxyl groups combined with each of adjacent carbon atoms comprising the aromatic ring used in the present invention decreases the viscosity and thus increases flowability of the epoxy resin composition. The aromatic compound (F) may be a monocyclic compound represented by the formula (15):

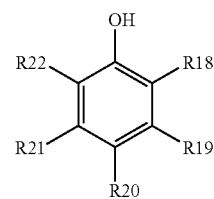

(15)

wherein one of R18 and R22 represents a hydroxyl group and the other represents a hydrogen atom, any substituent including a hydroxyl group; and R19, R20, and R21 each represent a hydrogen atom, any substituent including a hydroxyl group; or may be a polycyclic compound represented by the formula (16):

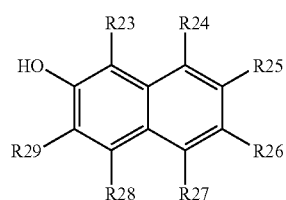

(16)

wherein one of R23 and R29 represents a hydroxyl group and the other represents a hydrogen atom, any substituent including a hydroxyl group; and R24, R25, R26, R27, and R28 each represent a hydrogen atom, any substituent including a hydroxyl group.

Examples of the monocyclic compound represented by the formula (15) include catechol, pyrogallol, gallic acid, gallate esters, and derivatives thereof. Examples of the polycyclic compound represented by the formula (16) include 1,2-dihydroxynaphthalene, 2,3-dihydroxynaphthalene, and derivatives thereof. Among these, compounds having two vicinal hydroxyl groups on their aromatic rings are preferred in view of flowability and control of curing. In view of a mixing process, the aromatic ring is preferably a naphthalene ring, which is lowly volatile and stable for weighing. Examples of the aromatic compound (F) having a naphthalene ring include 1,2-dihydroxynaphthalene, 2,3-dihydroxynaphthalene and derivatives thereof. These aromatic compounds (F) may be used alone or in combination.

The aromatic compound (F) content in the overall epoxy resin composition is in the range of preferably 0.01 weight % to 1 weight %, more preferably 0.03 weight % to 0.8 weight %, and most preferably 0.05 weight % to 0.5 weight %. An aromatic compound (F) content within this range leads to sufficiently low viscosity and high flowability of the epoxy resin composition by the synergy effect with the silane coupling agent (E). An aromatic compound (F) content within this range also leads to satisfactory curing of the epoxy resin composition and excellent physical properties of the cured composition.

The epoxy resin composition for semiconductor encapsulation, containing primary components (A) to (F), may further contain any additive, for example, natural waxes, such as carnauba wax; synthetic waxes, such as polyethylene wax; mold lubricants, such as higher fatty acids and metal salts thereof, e.g. stearic acid and zinc stearate, and paraffins; coloring agents, such as carbon black and colcothar; low-stress additives, such as silicone oils and silicone rubbers; inorganic ion-exchangers, such as bismuth oxide hydrate; metal hydroxides, such as aluminium hydroxide and magnesium hydroxide; and flame retardants, such as zinc borate, zinc molybdate, and phosphazene, if necessary.

It is preferred that the epoxy resin composition for semiconductor encapsulation of the present invention have a moisture absorption rate of 0.22 weight % or less when the composition is humidified at 85° C. and 85% R.H. for 168 hours. A moisture absorption rate within this range can suppress stress caused by vaporization of moisture during a soldering step in a surface mounting process. This prevents delamination in the semiconductor device and more specifically at the interface between the semiconductor element, lead frame, and inner lead and the cured epoxy resin composition, resulting in high reliability in semiconductor device. Such the moisture absorption rate of 0.22 weight % or less when the composition is humidified at 85° C. and 85% R.H. for 168 hours can be ensured by modifying the combination and formulation of the epoxy resin (A), the phenolic compound (B) containing two or more phenolic hydroxyl groups, inorganic filler (C), the curing accelerator (D), the silane coupling agent (E), the aromatic compound (F) having at least two hydroxyl groups combined with each of adjacent carbon atoms comprising the aromatic ring, and other additives. Such combination and formulation will be described in detail in EXAMPLES. In particular, the selection of the epoxy resin (A) and the phenolic compound (B) containing two or more phenolic hydroxyl groups and the proportion of the inorganic filler (C) are important. The lower limit of the moisture absorption rate when the composition is humidified at 85° C. and 85% R.H. for 168 hours is not limited, but is preferably 0.10 weight % or more and more preferably 0.15 weight % or more, in view of compatibility of flowability.

The epoxy resin composition for semiconductor encapsulation of the present invention may be prepared by homogeneously mixing the components (A) to (F) and any other additive at room temperature in a mixer, or may be kneading the homogenous mixture by hot rollers, a kneader, or an extruder, then cooling and pulverizing the mixture. The composition may be prepared to have desirable dispersibility and flowability.

Using the epoxy resin composition for semiconductor encapsulation, a semiconductor device may be produced by the following process, for example. A lead frame on which a semiconductor element is mounted is placed in a mold cavity. The epoxy resin composition for semiconductor encapsulation is supplied to the mold by transfer molding, compression molding, or injection molding and is cured in the mold.

In the present invention, a wide variety of semiconductor devices can be encapsulated using the epoxy resin composition. Examples of such semiconductor devices include integrated circuits, large scale integrated circuits, transistors, thyristors, diodes, and solid-state image sensing devices.

Examples of package of the semiconductor device in the present invention include, but not limited to, dual inline packages (DIPs), plastic leaded chip carriers (PLCCs), quad flat packages (QFPs), small outline packages (SOPs), small outline J-lead packages (SOJs), thin small outline packages (TSOPs), thin quad flat packages (TQFPs), tape carrier packages (TCPs), ball grid arrays (BGAs), and chip size packages (CSPs).

The semiconductor device, which is encapsulated by, for example, transfer molding, may be mounted on any electronic apparatus without post curing or after post curing at about 80° C. to about 200° C. for 10 minutes to 10 hours.

FIG. 1 is a cross-sectional view of a semiconductor device using an epoxy resin composition according to an embodiment of the present invention. A semiconductor element 1 is fixed on a die pad 3 with a cured die bond 2. The electrode pads of the semiconductor element 1 and lead frames 5 are bonded with gold wires 4. The semiconductor element 1 is encapsulated with a cured resin composition 6.

EXAMPLES

The present invention will now be described in detail by way of Examples, but should not be limited to these examples. In examples, the proportion of each component is represented by "parts by weight."

Example 1 Tohto Kasei Co., Ltd., SN-160L

Epoxy resin 1: Represented by the formula (17) and prepared by glycidyl-etherification of a phenol resin prepared by co-condensation of phenol, formaldehyde, and 2-methoxynaphthalene, with epichlorohydrin. Epoxy equivalent: 251, softening point: 58° C., and m/n=1/4 in the formula (17)): 9.05 parts by weight

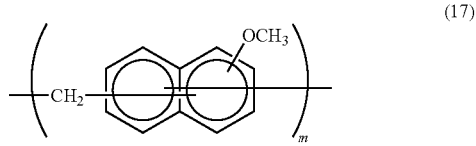

(17)

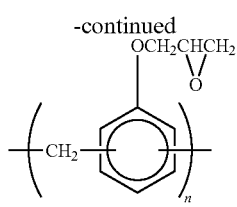

Phenol resin 1: Represented by the formula (5) (made by Sumitomo Durez, PR-HF-3, d=0 and k=3.0 in the formula (5), softening point: 80° C., hydroxyl group equivalent: 104): 3.75 parts by weight Fused spherical silica (average diameter: 30 μm): 86.00 parts by weight Curing accelerator 1: triphenylphosphine: 0.20 parts by weight Silane coupling agent 1: γ-glycidoxypropyltrimethoxysilane: 0.30 parts by weight 2,3-Dihydroxynaphthale: 0.20 parts by weight Carnauba wax: 0.20 parts by weight Carbon black: 0.30 parts by weight These compounds were mixed in a mixer at normal temperature, and were kneaded through hot rollers at 80 to 100° C. After being cooled, the mixture was pulverized to prepare an epoxy resin composition. The resulting epoxy resin composition was evaluated according to the following items. Table 1 shows the results.

Spiral flow: Using a low-pressure transfer molding machine (Kohtaki Precision Machine Co., Ltd., KTS-15), an epoxy resin composition was injected into a mold for measuring spiral flow according to EMMI-1-66 under conditions of a temperature of 175° C., an injection pressure of 6.9 MPa, and a pressure application time of 120 seconds to measure the flow length (cm). The spiral flow is an indicator of flowability and a larger value represents higher flowability.

Moisture absorption rate: Using a low-pressure transfer molding machine (Kohtaki Precision Machine Co., Ltd., KTS-30) an epoxy resin composition was injected under conditions of a temperature of 175° C., an injection pressure of 7.4 MPa, and a curing time of 120 seconds to form a test piece having a diameter of 50 mm and a thickness of 3 mm. The test piece was humidified at 85° C. and 85% R.H. (relative humidity) for 168 hours. The moisture absorption rate (weight %) was determined from an increase in weight by humidification.

Flame resistance: Using a low-pressure transfer molding machine (Kohtaki Precision Machine Co., Ltd., KTS-30), an epoxy resin composition was injected into a mold under conditions of a temperature of 175° C., an injection pressure of 9.8 MPa, an injection time of 15 seconds, and a curing time of 120 seconds to form a test piece of 127 mm by 12.7 mm by 3.2 mm thick. This test piece was subjected to flame resistance test according to a standard of UL94 vertical combustion test. Fmax, ΣF, and rank of flame resistance are shown in Tables 1 to 3.

Soldering resistance: Using a low-pressure transfer molding machine GP-ELF (Kohtaki Precision Machine Co. Ltd.), silicon chips (7 mm by 7 mm by 0.35 mm thick) were encapsulated with an epoxy resin composition under conditions of a temperature of 180° C., an injection pressure of 7.4 MPa, and a curing time of 120 seconds to form an 80-pin quad flat package (80pQFP; lead frame is cupper, package size is 14 mm by 20 mm by 2.00 mm thick, the chip and bonding pads of a circuit board are bonded with gold wires with a diameter of 25 μm). After six packages were postcured at 175° C. for 4 hours and humidified at 85° C. and 60% R.H. for 168 hours, these were subjected to an IR reflow treatment (260° C., JEDEC, Level 2). The internal delamination and cracks of the treated packages were observed with a scanning acoustic tomography to count the number (represented by "n"/6 in Tables 1 to 3) of defective packages.

Examples 2 to 18 and Comparative Examples 1 to 5

Epoxy resin compositions were produced as in EXAMPLE 1 according to formulations shown in Tables 1 to 3, and evaluated as in EXAMPLE 1. The results are shown in Tables 1 to 3.

Components newly used in these examples are as follows:

Epoxy resin 2: Represented by the formula (17) and prepared by glycidyl-etherification of a phenol resin prepared by co-condensation of phenol, formaldehyde, and 2-methoxynaphthalene, with epichlorohydrin. Epoxy equivalent: 220, softening point: 52° C., and m/n=1/9 in the formula (17)

Epoxy resin 3: Represented by the formula (17) and prepared by glycidyl-etherification of a phenol resin prepared by co-condensation of phenol, formaldehyde, and 2-methoxynaphthalene with epichlorohydrin. Epoxy equivalent: 270, softening point: 63° C., and m/n=3/7 in the formula (17)

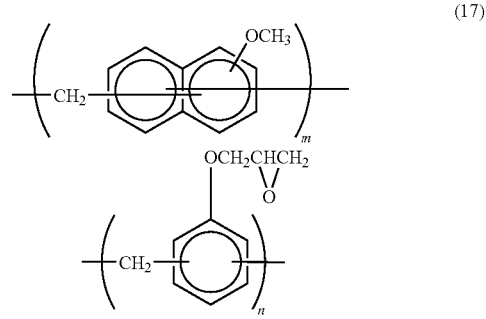

Epoxy resin 4: Represented by the formula (18) and prepared by glycidyl-etherification of a phenol resin prepared by co-condensation of phenol, formaldehyde, and methyl phenyl sulfide, with epichlorohydrin. Epoxy equivalent: 196, softening point: 54° C., and m/n=1/4 in the formula (18)

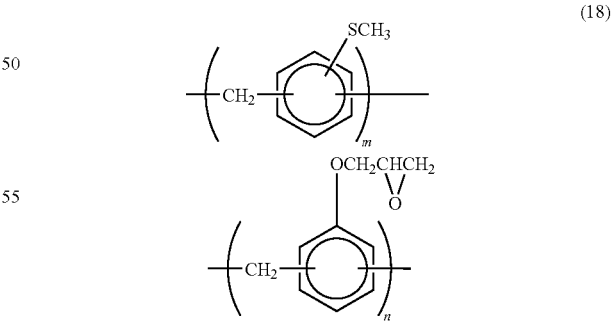

Epoxy resin 5: Phenol type aralkyl epoxy resin having a phenylene skeleton (prepared by co-condensation of phenol aralkyl resin having a phenylene skeleton with epichlorohydrin.

Epoxy equivalent: 238, softening point: 60° C.)

Epoxy resin 6: O-cresol novolak epoxy resin N660 (made by Dainippon Ink and Chemicals, Incorporated. Epoxy equivalent: 196, softening point: 62° C.)

Epoxy resin 7: Triphenolmethane-type epoxy resin E-1032H60 (made by Japan Epoxy Resins Co. Ltd. Epoxy equivalent: 169, softening point: 58° C.)

Phenol resin 2: Phenol aralkyl resin XLC-4L having a phenylene skeleton (made by Mitsui Chemicals, Inc. Hydroxyl group equivalent: 165, softening point: 65° C.)

Phenol resin 3: Triphenolmethane-type phenol resin MEH7500 (made by MEIWA PLASTIC INDUSTRIES, LTD. Hydroxyl group equivalent: 97, softening point: 110° C.)

Curing accelerator 2: 1,8-Diazabicyclo(5,4,0)undecene-7

Curing accelerator 3: Represented by the formula (19):

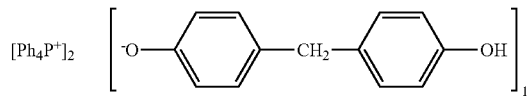

(19)

-continued $$\left[ HO-\!\!\!\!\bigcirc\!\!\!\!-CH_2-\!\!\!\!\bigcirc\!\!\!\!-OH \right]_1$$

Curing accelerator 3: Represented by the formula (20):

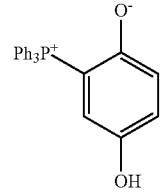

(20)

Silane coupling agent 2:
γ-mercaptopropyltrimethoxysilane
1,2-Dihydroxynaphthalene
Catechol
Pyrogallol

TABLE 1

| | EXAMPLES | | | | | | | | |
|---|---|---|---|---|---|---|---|---|---|
| | 1 | 2 | 3 | 4 | 5 | 6 | 7 | 8 | 9 |
| Epoxy resin 1 | 9.05 | | | | 4.50 | 8.50 | 9.05 | 9.05 | 9.05 |
| Epoxy resin 2 | | 8.65 | | | | | | | |
| Epoxy resin 3 | | | 9.25 | | | | | | |
| Epoxy resin 4 | | | | 8.35 | | | | | |
| Epoxy resin 5 | | | | | 4.50 | | | | |
| Phenol resin 1 | 3.75 | 4.15 | 3.55 | 4.45 | 3.80 | 2.15 | 3.75 | 3.75 | 3.75 |
| Phenol resin 2 | | | | | | 2.15 | | | |
| Fused spherical silica | 86.0 | 86.0 | 86.0 | 86.0 | 86.0 | 86.0 | 86.0 | 86.0 | 86.0 |
| Curing accelerator 1 | 0.2 | 0.2 | 0.2 | 0.2 | 0.2 | 0.2 | | | |
| Curing accelerator 2 | | | | | | | 0.2 | | |
| Curing accelerator 3 | | | | | | | | 0.2 | |
| Curing accelerator 4 | | | | | | | | | 0.2 |
| Silane coupling agent 1 | 0.3 | 0.3 | 0.3 | 0.3 | 0.3 | 0.3 | 0.3 | 0.3 | 0.3 |
| Silane coupling agent 2 | | | | | | | | | |
| 2,3-Dihydroxynaphthalene | 0.2 | 0.2 | 0.2 | 0.2 | 0.2 | 0.2 | 0.2 | 0.2 | 0.2 |
| Carnauba wax | 0.2 | 0.2 | 0.2 | 0.2 | 0.2 | 0.2 | 0.2 | 0.2 | 0.2 |
| Carbon black | 0.3 | 0.3 | 0.3 | 0.3 | 0.3 | 0.3 | 0.3 | 0.3 | 0.3 |
| Spiral flow (cm) | 138 | 151 | 125 | 130 | 130 | 130 | 133 | 148 | 135 |
| Moisture absorption rate (weight %) | 0.18 | 0.19 | 0.17 | 0.19 | 0.17 | 0.17 | 0.18 | 0.18 | 0.18 |
| Flame resistance Fmax | 5 | 6 | 4 | 5 | 5 | 4 | 5 | 5 | 5 |
| UL94 vertical ΣF | 40 | 49 | 30 | 44 | 45 | 35 | 41 | 42 | 41 |
| (3.2 mm thick) Rank | V-0 | V-0 | V-0 | V-0 | V-0 | V-0 | V-0 | V-0 | V-0 |
| Soldering resistance (n/6) | 0/6 | 0/6 | 0/6 | 0/6 | 0/6 | 0/6 | 0/6 | 0/6 | 0/6 |

TABLE 2

| | EXAMPLES | | | | | | | | |
|---|---|---|---|---|---|---|---|---|---|
| | 10 | 11 | 12 | 13 | 14 | 15 | 16 | 17 | 18 |
| Epoxy resin 1 | 9.05 | 9.05 | 9.05 | 9.19 | 9.05 | 9.25 | 8.70 | 10.50 | 6.20 |
| Phenol resin 1 | 3.75 | 3.75 | 3.75 | 3.80 | 3.75 | 3.84 | 3.60 | 4.30 | 2.60 |
| Fused spherical silica | 86.0 | 86.0 | 86.0 | 86.0 | 86.0 | 86.0 | 86.0 | 84.0 | 90.0 |
| Curing accelerator 1 | 0.2 | 0.2 | 0.2 | 0.2 | 0.2 | 0.2 | 0.2 | 0.2 | 0.2 |
| Silane coupling agent 1 | 0.3 | 0.3 | 0.3 | 0.3 | | 0.01 | 0.8 | 0.3 | 0.3 |
| Silane coupling agent 2 | | | | | 0.3 | | | | |
| 2,3-Dihydroxynaphthalene | | | | 0.01 | 0.2 | 0.2 | 0.2 | 0.2 | 0.2 |
| 1,2-Dihydroxynaphthalene | 0.2 | | | | | | | | |

TABLE 2-continued

| | EXAMPLES | | | | | | | | |
|---|---|---|---|---|---|---|---|---|---|
| | 10 | 11 | 12 | 13 | 14 | 15 | 16 | 17 | 18 |
| Catechol | | 0.2 | | | | | | | |
| Pyrogallol | | | 0.2 | | | | | | |
| Carnauba wax | 0.2 | 0.2 | 0.2 | 0.2 | 0.2 | 0.2 | 0.2 | 0.2 | 0.2 |
| Carbon black | 0.3 | 0.3 | 0.3 | 0.3 | 0.3 | 0.3 | 0.3 | 0.3 | 0.3 |
| Spiral flow (cm) | 140 | 140 | 148 | 120 | 142 | 120 | 145 | 160 | 100 |
| Moisture absorption rate (weight %) | 0.18 | 0.18 | 0.18 | 0.16 | 0.18 | 0.18 | 0.19 | 0.21 | 0.16 |
| Flame resistance Fmax | 5 | 5 | 5 | 6 | 5 | 5 | 5 | 6 | 4 |
| UL94 vertical ΣF | 40 | 40 | 40 | 49 | 40 | 40 | 40 | 45 | 25 |
| (3.2 mm thick) Rank | V-0 | V-0 | V-0 | V-0 | V-0 | V-0 | V-0 | V-0 | V-0 |
| Soldering resistance (n/6) | 0/6 | 0/6 | 0/6 | 0/6 | 0/6 | 0/6 | 0/6 | 0/6 | 0/6 |

TABLE 3

| | COMPARATIVE EXAMPLES | | | | |
|---|---|---|---|---|---|
| | 1 | 2 | 3 | 4 | 5 |
| Epoxy resin 1 | | 14.71 | 0.40 | 9.23 | 9.22 |
| Epoxy resin 6 | 8.40 | | | | |
| Epoxy resin 7 | | | 7.57 | | |
| Phenol resin 1 | 4.40 | 6.09 | 4.83 | | 0.18 |
| Phenol resin 3 | | | | 3.57 | 3.40 |
| Fused spherical silica | 86.0 | 78.0 | 86.0 | 86.0 | 86.0 |
| Curing accelerator 1 | 0.2 | 0.2 | 0.2 | 0.2 | 0.2 |
| Silane coupling agent 1 | 0.3 | 0.3 | 0.3 | 0.3 | 0.3 |
| 2,3-Dihydroxynaphthalene | 0.2 | 0.2 | 0.2 | 0.2 | 0.2 |
| Carnauba wax | 0.2 | 0.2 | 0.2 | 0.2 | 0.2 |
| Carbon black | 0.3 | 0.3 | 0.3 | 0.3 | 0.3 |
| Spiral flow (cm) | 114 | 220 | 100 | 110 | 127 |
| Moisture absorption rate (weight %) | 0.24 | 0.30 | 0.25 | 0.27 | 0.25 |
| Flame resistance Fmax | 30 | 10 | 30 | 30 | 30 |
| UL94 vertical ΣF | 150 | 60 | 150 | 150 | 150 |
| (3.2 mm thick) Rank | Burnout | V-1 | Burnout | Burnout | Burnout |
| Soldering resistance (n/6) | 3/6 | 5/6 | 4/6 | 4/6 | 3/6 |

The epoxy resin (a1) used in EXAMPLES 1 to 18 is represented by the formula (1). This epoxy resin is inexpensive and can readily be processed. In these examples, the type and proportion of the epoxy resin (a1), the type and proportion of the phenolic compound (B) having two or more phenolic hydroxyl groups, the proportion of the inorganic filler (C), the type of the curing accelerator (D), the type and proportion of the silane coupling agent (E), and the type and proportion of the aromatic compound (F) having at least two hydroxyl groups combined with each of adjacent carbon atoms comprising the aromatic ring are varied. The moisture absorption rate of each cured resin composition after humidified at 85° C. and 85% R.H. for 168 hours is 0.22 weight % or less, resulting in high flowability (spiral flow), high flame resistance, and high soldering resistance.

In contrast, COMPARATIVE EXAMPLE 1 prepared as in EXAMPLE 1 except that o-cresol novolak epoxy resin is used in place of the epoxy resin (a1) represented by the formula (1) shows a higher moisture absorption rate, resulting in low flame resistance and low soldering resistance. COMPARATIVE EXAMPLE 2 containing the epoxy resin (a1) represented by the formula (1) and the inorganic filler in an amount less than 80 weight %, COMPARATIVE EXAMPLE 3 containing the triphenolmethane-type epoxy resin in addition to the epoxy resin (a1), and COMPARATIVE EXAMPLES 4 and 5 containing triphenolmethane-type phenol resins as curing agent exhibit high moisture absorption rates and thus poor soldering resistance after humidification. COMPARATIVE EXAMPLES 3 to 5 exhibit poor flame resistance, and COMPARATIVE EXAMPLES 3 and 4 exhibit low flowability.

These results show that EXAMPLES 1 to 18 exhibit high flame resistance and high soldering resistance after humidification without use of a bromine-based flame retardant and an antimony compound, regardless of low material cost.

The epoxy resin composition of the present invention exhibits high flame resistance and high soldering resistance after humidification regardless of low material cost and is suitable for surface-mounted semiconductor devices.

It is apparent that the present invention is not limited to the above embodiment, and may be modified and changed without departing from the scope and spirit of the invention.

What is claimed is:

1. A resin composition for semiconductor encapsulation, comprising:

(A) an epoxy resin;

(B) a phenolic compound containing two or more phenolic hydroxyl groups;

(C) an inorganic filler; and (D) a curing accelerator;

wherein the epoxy resin (A) comprises an epoxy resin (a1) represented by the formula (1), and the resin composition has a moisture absorption rate of 0.22 weight % or less when the composition is humidified at 85° C. and 85% R.H. for 168 hours:

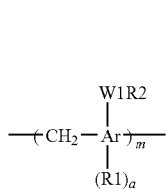 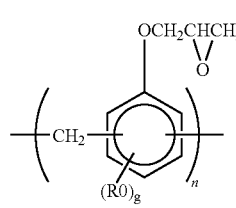

(1)

wherein Ar represents an aryl group having 6 to 20 carbon atoms; R1's each represent a hydrocarbon group having 1 to 6 carbon atoms and may be the same or different; R2 represents a hydrocarbon group having 1 to 4 carbon atoms; W1 represents an oxygen or sulfur atom; R0's each represent a hydrocarbon group having 1 to 6 carbon atoms and may be the same or different; a is an integer of 0 to 10; g is an integer of 0 to 3; and m and n represent molar ratios and satisfy $0<m<1$, $0<n<1$, $m+n=1$, and the ratio $m/n=1/10$ to $1/1$.

2. The resin composition as set forth in claim 1, wherein the epoxy resin (a1) is a glycidyl-etherification product of a phenol resin with epichlorohydrin, the phenol resin being a co-condensation product of a phenol, an aldehyde, and a compound (G) represented by the formula (2):

(2)

wherein Ar represents an aryl group having 6 to 20 carbon atoms; R1's each represent a hydrocarbon group having 1 to 6 carbon atoms and may be the same or different; R2 represents a hydrocarbon group having 1 to 4 carbon atoms; W1 represents an oxygen or sulfur atom; and a is an integer of 0 to 10.

3. The resin composition as set forth in claim 1, wherein the epoxy resin (a1) is represented by the formula (3):

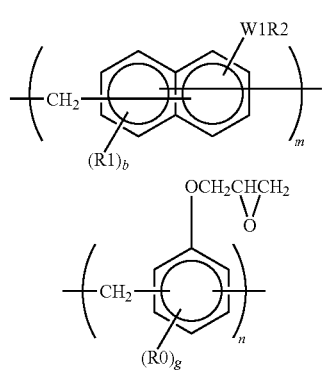

(3)

wherein R1's each represent a hydrocarbon group having 1 to 6 carbon atoms and may be the same or different; R2 represents a hydrocarbon group having 1 to 4 carbon atoms; W1 represents an oxygen or sulfur atom; R0's each represent a hydrocarbon group having 1 to 6 carbon atoms and may be the same or different; b is an integer of 0 to 5; g is an integer of 0 to 3; and m and n represent molar ratios and satisfy $0<m<1$, $0<n<1$, $m+n=1$, and the ratio $m/n=1/10$ to $1/1$.

4. The resin composition as set forth in claim 3, wherein the epoxy resin is represented by the formula (4):

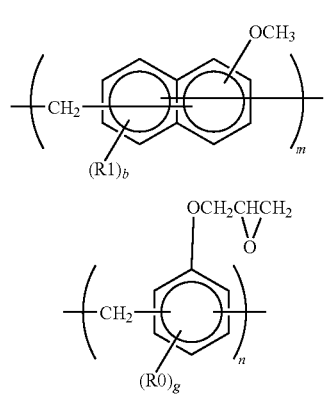

(4)

wherein R1's each represent a hydrocarbon group having 1 to 6 carbon atoms and may be the same or different; R0's each represent a hydrocarbon group having 1 to 6 carbon atoms and may be the same or different; b is an integer of 0 to 5; g is an integer of 0 to 3; and m and n represent molar ratios and satisfy $0<m<1$, $0<n<1$, $m+n=1$, and the ratio $m/n=1/10$ to $1/1$.

5. The resin composition as set forth in claim 1, wherein the phenolic compound (B) is represented by the formula (5):

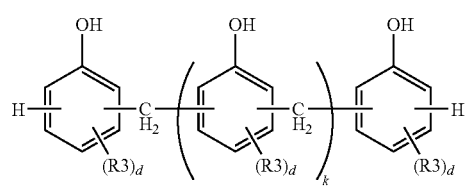

(5)

wherein R3's each represent a hydrocarbon group having 1 to 4 carbon atoms and may be the same or different; d is an integer of 0 to 2; and the average of k is in the range of 0 to 8.

6. The resin composition as set forth in claim 1, wherein the curing accelerator (D) is at least one compound selected from the group consisting of a compound represented by the formula (6), a compound represented by the formula (7), a compound represented by the formula (8), and a compound represented by the formula (9):

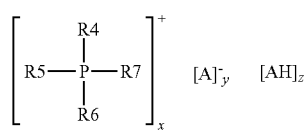

(6)

wherein P represents a phosphorus atom; R4, R5, R6, and R7 each represent an aryl or alkyl group; A represents an anion of an aromatic organic acid having at least one functional group selected from the group consisting of a hydroxyl group, a carboxyl group, and a thiol group in the aromatic ring; AH represents an aromatic organic acid having at least one functional group selected from the group consisting of a hydroxyl group, a carboxyl group, and a thiol group in the aromatic ring; x and y each represent an integer of 1 to 3; z represents an integer of 0 to 3; and x=y;

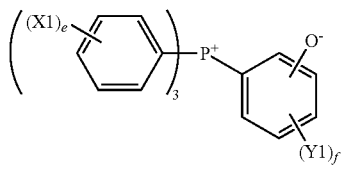

wherein X1 represents an alkyl group having 1 to 3 carbon atoms; Y1 represents a hydroxyl group; and e and f represents an integer of 0 to 3;

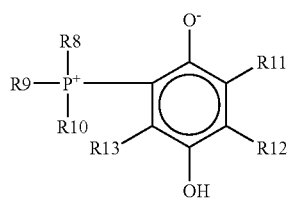

wherein P represents a phosphorus atom; R8, R9, and R10 represent alkyl groups each having 1 to 12 carbon atoms or aryl groups each having 6 to 12 carbon atoms and may be the same or different; R11, R12, and R13 represent hydrogen atoms or hydrocarbon groups each having 1 to 12 carbon atoms and may be the same or different where R11 and R12 may be mutually linked to form a cyclic structure; and

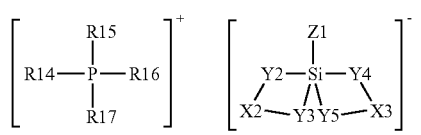

wherein P represents a phosphorus atom; Si represents a silicon atom; R14, R15, R16, and R17 represent organic groups each having an aromatic or heterocyclic ring or aliphatic groups and may be the same or different; X2 represents an organic group linked with both groups Y2 and Y3; X3 represents an organic group linked with both groups Y4 and Y5; Y2 and Y3 each represent a proton donor moiety from which two protons are lost, and are linked with the silicon atom to form a chelate structure; Y4 and Y5 each represent a proton donor moiety from which two protons are lost, and are linked with the silicon atom to form a chelate structure; X2 and X3 may be the same or different; Y2, Y3, Y4, and Y5 are the same or different; and Z1 represents an organic group having an aromatic ring or heterocyclic ring or an aliphatic group.

7. The resin composition as set forth in claim 1, further comprising:
(E) a silane coupling agent; and
(F) an aromatic compound having at least two hydroxyl groups combined with each of adjacent carbon atoms comprising the aromatic ring.

8. The resin composition as set forth in claim 7, wherein the aromatic compound (F) has two hydroxyl groups combined with each of adjacent carbon atoms comprising the aromatic ring.

9. The resin composition as set forth in claim 7, wherein the aromatic compound (F) has a naphthalene ring and at least two hydroxyl groups combined with each of adjacent carbon atoms comprising the naphthalene ring.

10. The resin composition as set forth in claim 7, wherein the aromatic compound (F) has a naphthalene ring and two hydroxyl groups combined with each of adjacent carbon atoms comprising the naphthalene ring.

11. The resin composition as set forth in claim 7, wherein the resin composition contains the compound (F) in an amount of 0.01 weight % or more to 1 weight % or less to the total weight of the resin composition.

12. The resin composition as set forth in claim 7, wherein the resin composition contains the silane coupling agent (E) in an amount of 0.01 weight % or more to 1 weight % or less to the total weight of the resin composition.

13. The resin composition as set forth in claim 7, wherein the resin composition contains the inorganic filler (C) in an amount of 80 weight % or more to 92 weight % or less to the total weight of the resin composition.

14. A semiconductor device comprising:
a semiconductor element encapsulated by the cured resin of resin composition as set forth in claim 1.

* * * * *